(12) United States Patent
Kudo et al.

(10) Patent No.: US 11,421,468 B2
(45) Date of Patent: Aug. 23, 2022

(54) CLOSING SERVER-RACK DOOR USING ACOUSTIC NOISE AND ACCELERATION

(71) Applicant: INTERNATIONAL BUSINESS MACHINES CORPORATION, Armonk, NY (US)

(72) Inventors: Ruriko Kudo, Saitama (JP); Yasuharu Katsuno, Kawasaki (JP); Fumiko Akiyama, Tokyo (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 451 days.

(21) Appl. No.: 16/737,404

(22) Filed: Jan. 8, 2020

(65) Prior Publication Data

US 2021/0207422 A1    Jul. 8, 2021

(51) Int. Cl.
*E05F 15/76* (2015.01)
*E05F 15/77* (2015.01)
*H05K 7/14* (2006.01)
*H05K 5/02* (2006.01)
*E05F 15/73* (2015.01)

(52) U.S. Cl.
CPC .............. *E05F 15/76* (2015.01); *E05F 15/77* (2015.01); *H05K 5/0217* (2013.01); *H05K 7/1488* (2013.01); *E05F 2015/763* (2015.01); *E05Y 2400/44* (2013.01); *E05Y 2400/85* (2013.01); *E05Y 2900/20* (2013.01)

(58) Field of Classification Search
None
See application file for complete search history.

(56) References Cited

U.S. PATENT DOCUMENTS 10,819,737 B2 * 10/2020 Lev ..................... H04L 63/1491
2014/0279180 A1   10/2014 Cho
2017/0339585 A1   11/2017 Cortes et al.
(Continued)

OTHER PUBLICATIONS

Garcia-Ceja, et al., "Multi-View Stacking for Activity Recognition with Sound and Accelerometer Data", ScienceDirect, Information Fusion, Mar. 2018, pp. 45-56, vol. 40.
(Continued)

*Primary Examiner* — K. Wong
(74) *Attorney, Agent, or Firm* — Tutunjian & Bitetto, P.C.; Randall Bluestone

(57) ABSTRACT

A system is provided for automatically closing a server-rack door. A microphone acquires sound data and an acceleration sensor acquires acceleration data. A controller determines at least one time when a volume of the sound data exceeds a threshold. The controller identifies at least one waveform from the acceleration data which matches (i) an opening waveform or (ii) a closing waveform. The controller checks, for each given waveform from among the at least one waveform, if the at least one time is within a time range of the given waveform and, if so, determine that the user is opening or closing the server-rack door by identifying the given waveform as matching the opening or closing waveform. The controller provides a notification of an open status of the server-rack door based on numbers of opening and closing waveforms. The controller automatically closes the server-rack door, responsive to the notification.

20 Claims, 5 Drawing Sheets

(56) References Cited

U.S. PATENT DOCUMENTS

2019/0036964 A1    1/2019   Lev et al.
2019/0260829 A1    8/2019   Cencini et al.

OTHER PUBLICATIONS

Hayashi et al., Daily Activity Recognition Based on DNN Using Environmental Sound and Acceleration Signals, 23rd European Signal Processing Conference, Aug. 2015, pp. 2351-2355.

"The Key is IoT YKK Ap's Minot Informs Smartphones of Forgetting to Close", Construction IT Blog, Nov. 2018, pp. 1-7, available at: http://ieiri-lab.jp/it/2018/11/ykk-ap-mimott.html (English translation).

San-Segundo et al., "Robust Human Activity Recognition Using Smartwatches and Smartphones", ScienceDirect, Engineering Applications of Artificial Intelligence, Jun. 2018, pp. 190-202, vol. 72.

Shoaib et al., "Complex Human Activity Recognition Using Smartphone and Wrist-Worn Motion Sensors", MDPI Sensors 2016, March, pp. 1-24.

\* cited by examiner

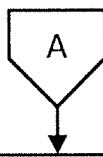

Check, by the controller, for each given waveform from among the at least one waveform, if the at least one time (determined per block 430) is within a time range of the given waveform and, if so, determine that the user is opening or closing the server-rack door by identifying the given waveform as matching the opening waveform or the closing waveform. The door can be determined to be open when the numbers of opening waveforms and closing waveforms are unequal or when a sum of the numbers of opening waveforms and closing waveforms is odd-numbered. The door can be determined to be open when the numbers of opening waveforms and closing waveforms are equal or when a sum of the numbers of opening waveforms and closing waveforms is even-numbered. — 450

Provide, by the controller, a notification of an open status of the server-rack door based on numbers of opening waveforms and closing waveforms indicating the open status. — 460

Automatically close, by the controller, the server-rack door, responsive to the notification. The server rack door can be automatically closed responsive to the notification and a close-door signal initiated by the user. Any of an electronic, a magnetic or an electromagnetic door closing system can be used to automatically close the server-rack door, responsive to a close door confirmation signal from the controller. — 470

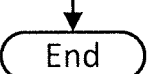

FIG. 5

CLOSING SERVER-RACK DOOR USING ACOUSTIC NOISE AND ACCELERATION

BACKGROUND

The present invention generally relates to computing systems, and more particularly to a method and system for closing a server-rack door using acoustic noise and acceleration. The typical solution is for a maintenance engineer to manually check whether all server-rack doors are closed. Hence, there is a need for an improved approach for checking whether all server-rack doors are closed.

SUMMARY

According to an aspect of the present invention, a system is provided for automatically closing a server-rack door. The system includes a microphone, comprised in a device carried by a user, configured to acquire sound data. The system further includes an acceleration sensor, comprised in the device, configured to acquire acceleration data in a walking direction of the user. The system also includes a controller, operatively coupled to the microphone and the acceleration sensor, configured to determine at least one time when a volume of the sound data exceeds a threshold. The controller is further configured to identify at least one waveform from the acceleration data which matches (i) an opening waveform representing an acceleration waveform when the user is opening a server-rack door among a plurality of server-rack doors or (ii) a closing waveform representing an acceleration waveform when the user is closing the server-rack door and displaying a symmetrized shape of the first waveform. The controller is also configured to check, for each given waveform from among the at least one waveform, if the at least one time is within a time range of the given waveform and, if so, determine that the user is opening or closing the server-rack door by identifying the given waveform as matching the opening waveform or the closing waveform. The controller is additionally configured to provide a notification of an open status of the server-rack door based on numbers of opening waveforms and closing waveforms indicating the open status. The controller is further configured to automatically close the server-rack door, responsive to the notification.

According to another aspect of the present invention, a method is provided for automatically closing a server-rack door. The method includes acquiring, by a microphone comprised in a device carried by a user, sound data. The method further includes acquiring, by an acceleration sensor comprised in the device, acceleration data in a walking direction of the user. The method also includes determining, by a controller operatively coupled to the microphone and the acceleration sensor, at least one time when a volume of the sound data exceeds a threshold. The method additionally includes identifying, by the controller, at least one waveform from the acceleration data which matches (i) an opening waveform representing an acceleration waveform when the user is opening a server-rack door among a plurality of server-rack doors or (ii) a closing waveform representing an acceleration waveform when the user is closing the server-rack door and displaying a symmetrized shape of the first waveform. The method further includes checking, by the controller, for each given waveform from among the at least one waveform, if the at least one time is within a time range of the given waveform and, if so, determining that the user is opening or closing the server-rack door by identifying the given waveform as matching the opening waveform or the closing waveform. The method also includes providing, by the controller, a notification of an open status of the server-rack door based on numbers of opening waveforms and closing waveforms indicating the open status. The method additionally includes automatically closing, by the controller, the server-rack door, responsive to the notification.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIGS. 4-5 are block diagrams showing an exemplary method for automatically closing a server-rack door using acoustic noise and acceleration, in accordance with an embodiment of the present invention.

DETAILED DESCRIPTION

Embodiments of the present invention are directed to closing a server-rack door using acoustic noise and acceleration.

One or more embodiments of the present invention involve using sound/accelerator sensors of a smartphone that maintenance engineers typically carry for their work.

In an embodiment, the present invention determines the time when a volume value, in an area proximate to a plurality server-rack doors, exceeds a threshold, and collects acceleration data in a direction a user is walking. The acceleration data can be broken down into steps that represent certain actions. The present invention detects the waveform of an "open door" action from the collected acceleration data (step back from door), and detects the waveform of a "close door" action (step towards door) by using a symmetrized version of the waveform of an "open door" action. Then, the time slot for each action ("open door" and "closed door") is obtained. Using the time when the volume exceeds the threshold, it is checked whether that time is within the time range of an of an "open door" action or a "close door" action. If the time when the volume exceeds the threshold is within the time range of the detected action, it is determined that the door has been opened and closed. Otherwise, the door is determined to be opened, causing an automatic closing of the door. In this way, safety and security of the equipment in the server rack can be automatically maintained. In an embodiment, a notification can be provided to a user that the server-door is open. In an embodiment, the notification can be provided to allow the user to initiate a close door signal to facilitate the closing of the door so as to assure that the worker is done in that rack and the door can be closed. These and other aspects and variations of the present invention are described herein.

Figure 1:
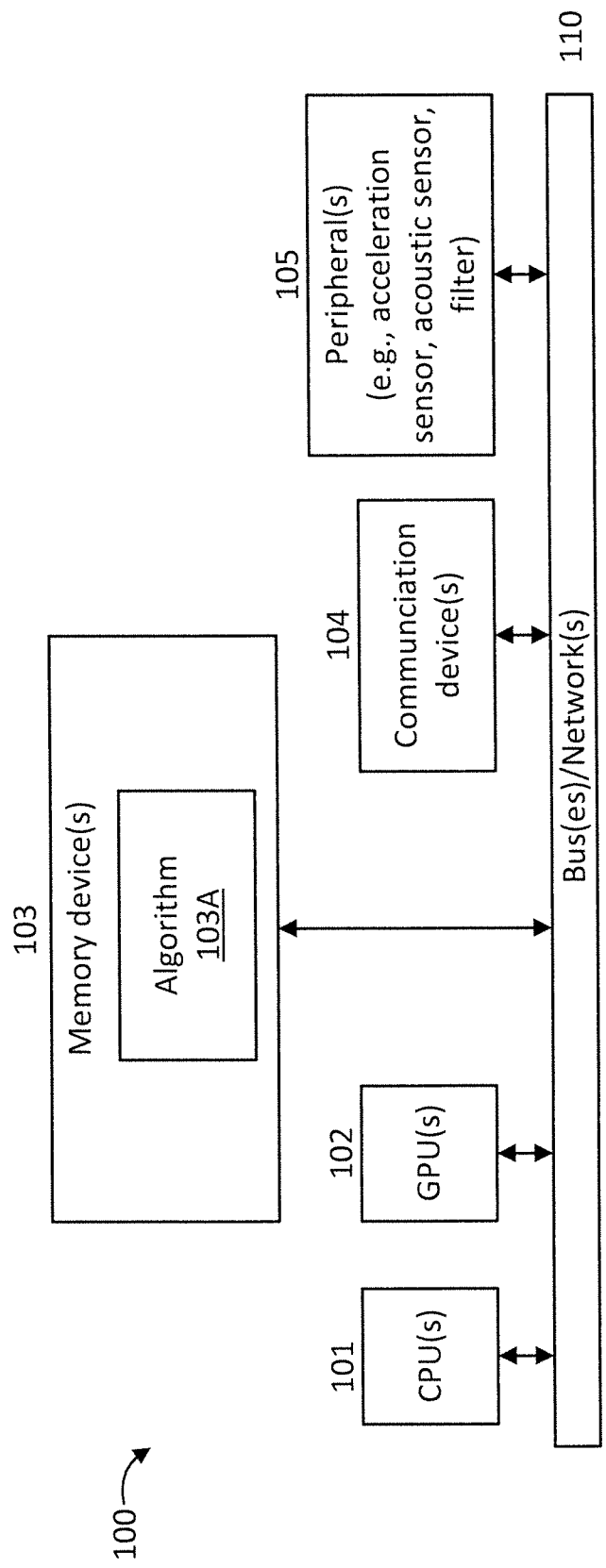
FIG. 1 is a block diagram showing an exemplary enhanced processing system, in accordance with an embodiment of the present invention.

FIG. 1 is a block diagram showing an exemplary enhanced processing system 100, in accordance with an embodiment of the present invention. The processing system 100 includes a set of processing units (e.g., CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a microphone, an acceleration sensor, a computing device controlled physical lock (e.g., electromagnetic, electronic, magnetic, etc.), motors (for opening and closing server-rack doors) a display device, a user input device, a printer, an imaging device, and so forth. Elements of processing system 100 are connected by one or more buses or networks (collectively denoted by the figure reference numeral 110).

In an embodiment, memory devices 103 can store specially programmed software modules to transform the computer processing system into a special purpose computer configured to implement various aspects of the present invention. In an embodiment, special purpose hardware (e.g., Application Specific Integrated Circuits, Field Programmable Gate Arrays (FPGAs), and so forth) can be used to implement various aspects of the present invention.

In an embodiment, memory devices 103 store an algorithm 103A for automatically determining an open/close status of a server-rack door and closing an open server-rack door.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized. These and other variations of the processing system 100 are readily contemplated by one of ordinary skill in the art given the teachings of the present invention provided herein.

Moreover, it is to be appreciated that various figures as described below with respect to various elements and steps relating to the present invention that may be implemented, in whole or in part, by one or more of the elements of system 100.

It is to be appreciated that the processing system 100 can be implemented by a cell phone, a tablet, or some other mobile device having at least a microphone, an acceleration sensor, and a controller.

As employed herein, the term "hardware processor subsystem" or "hardware processor" can refer to a processor, memory, software or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), FPGAs, and/or PLAs.

These and other variations of a hardware processor subsystem are also contemplated in accordance with embodiments of the present invention.

Figure 2:
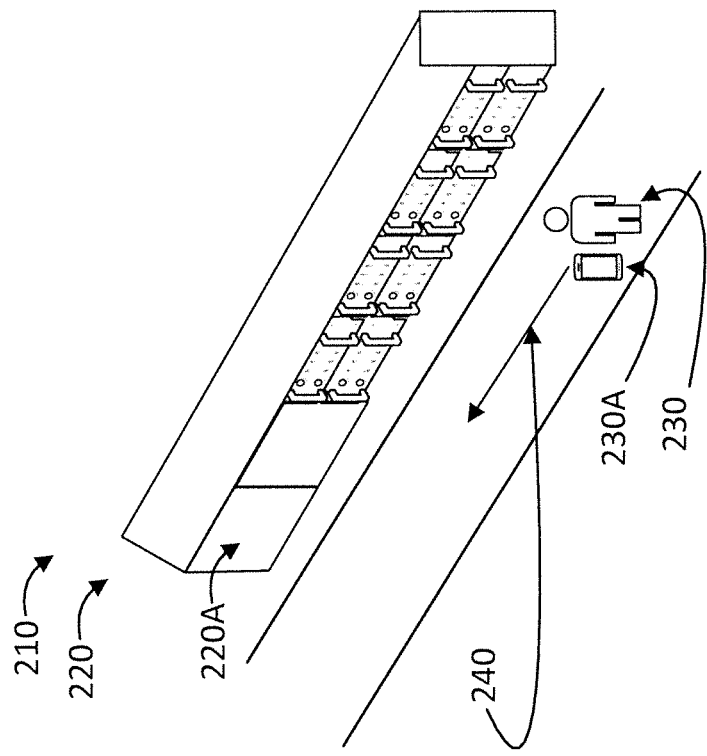
FIG. 2 is a block diagram showing an exemplary environment to which the present invention can be applied, in accordance with an embodiment of the present invention.

FIG. 2 is a block diagram showing an exemplary environment 200 to which the present invention can be applied, in accordance with an embodiment of the present invention.

The environment 200 includes a set of rack-mounted servers 210 in racks 220.

The racks 220 have doors 220A whose open/close status is determined by the present invention for the purpose of identifying and closing open rack doors where no technician is operating on the rack and it is simply running as normal but with an open door as a vulnerability that needs to be addressed by the closing of the open rack doors.

The racks 220 are arranged in rows (with one row shown for the sake of illustration), passed which a user 230 walks in order to determine the open/close status of any given door using acoustic noise and acceleration as described herein. The arrow 240 depicts the direction of movement of the user 230 carrying a user device 230A (e.g., a smart phone, a tablet, etc.). For the sake of illustration, the last two bays have their server-rack doors closed, while remaining bays do not. This open status of the server-rack doors of the remaining bays is detectable and addressable by the instant application. For example, an open door whose bay is currently not under work (as determined by the absence of a technician in front as determined from acceleration data and optionally work order information) can be automatically closed by the present invention. Such closure can involve a closure confirmation signal from a user to ensure a door is not mistakenly closed. Such closure can further involve a motor installed in each bay that opens and closes a door responsive to a door closure signal(s) (e.g., simply an automatic signal and/or one governed by a super-ceding confirmation signal from a user or the system).

Figure 3:
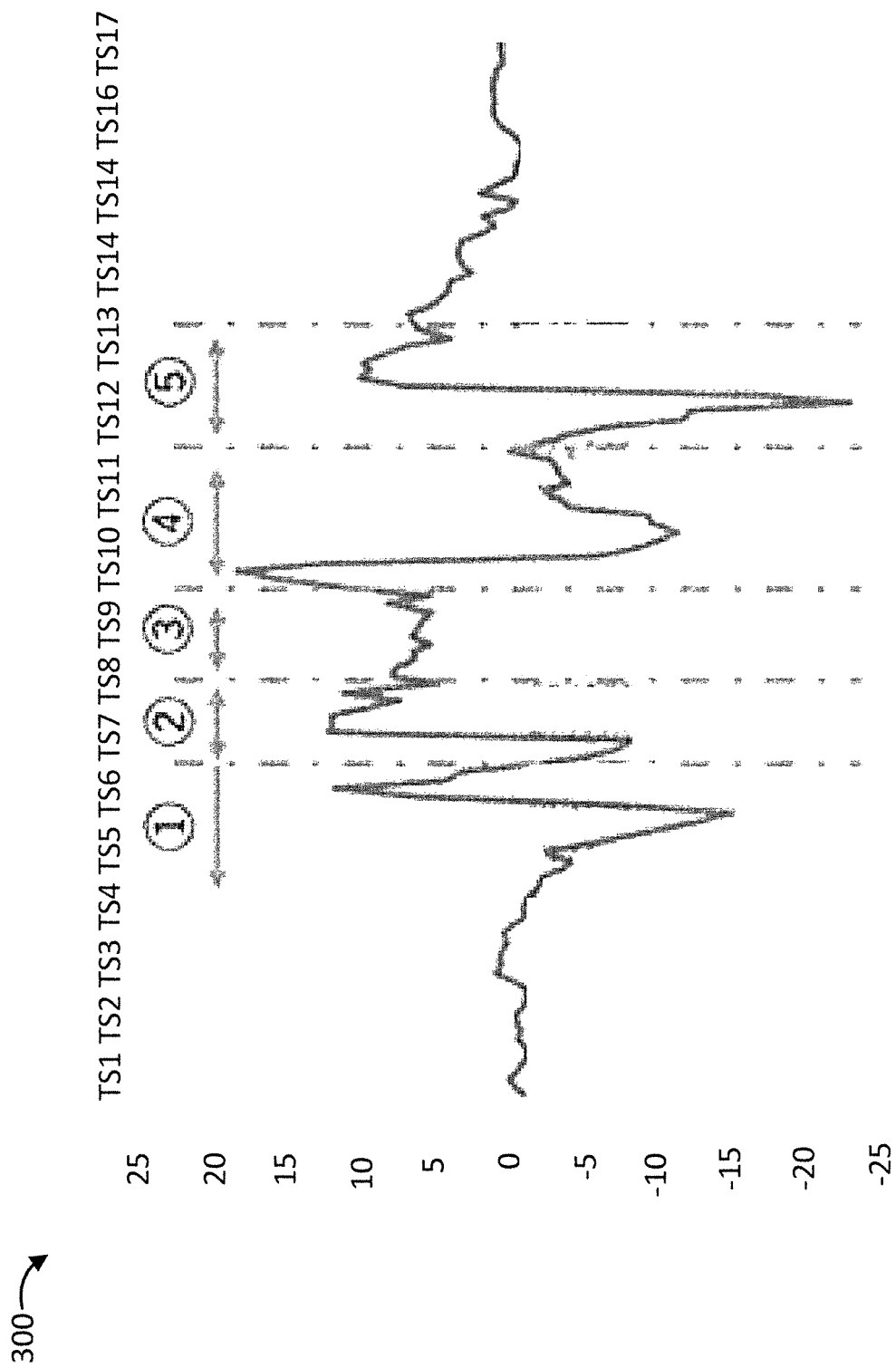
FIG. 3 shows an exemplary acceleration waveform corresponding to a direction of a user's movement, in accordance with an embodiment of the present invention.

FIG. 3 shows an exemplary acceleration waveform 300 corresponding to a direction of a user's movement, in accordance with an embodiment of the present invention.

The acceleration waveform 300 is delineated by a plurality of timestamps (TS1-TS17). The granularity of the timestamps can vary depending upon the application.

The following correlations apply:
(1) walk towards the door
(2) approach the door (=one step ahead)
(3) unlock the door (=no walk)
(4) open the door (+one step behind)
(5) approach the inside of the rack and start work (=one step ahead).

As can be seen, the user's actions can be discretized using the acceleration sensor, in conjunction with sound data as described herein.

Figure 4:
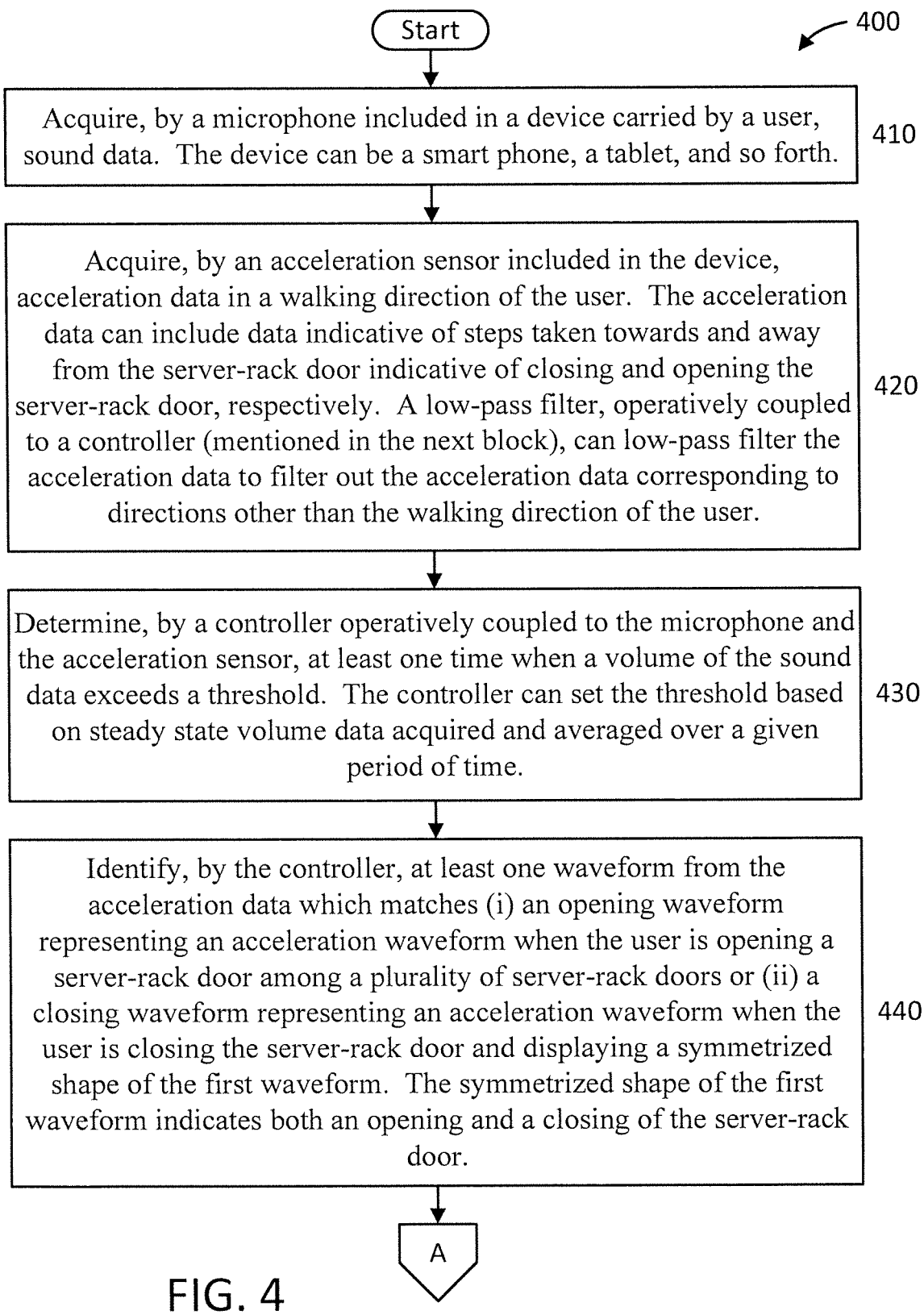

FIGS. 4-5 are block diagrams showing an exemplary method 400 for automatically closing a server-rack door using acoustic noise and acceleration, in accordance with an embodiment of the present invention.

At block 410, acquire, by a microphone included in a device carried by a user, sound data. The device can be a smart phone, a tablet, and so forth.

At block 420, acquire, by an acceleration sensor included in the device, acceleration data in a walking direction of the user. In an embodiment, the acceleration data can include data indicative of steps taken towards and away from the server-rack door indicative of closing and opening the server-rack door, respectively. In an embodiment, a low-pass filter, operatively coupled to a controller (mentioned in the next block), can low-pass filter the acceleration data to filter out the acceleration data corresponding to directions other than the walking direction of the user.

At block 430, determine, by a controller operatively coupled to the microphone and the acceleration sensor, at least one time when a volume of the sound data exceeds a threshold. In an embodiment, the controller can set the threshold based on steady state volume data acquired and averaged over a given period of time.

At block 440, identify, by the controller, at least one waveform from the acceleration data which matches (i) an opening waveform representing an acceleration waveform when the user is opening a server-rack door among a plurality of server-rack doors or (ii) a closing waveform representing an acceleration waveform when the user is closing the server-rack door and displaying a symmetrized shape of the first waveform. The symmetrized shape of the first waveform indicates both an opening and a closing of the server-rack door.

At block 450, check, by the controller, for each given waveform from among the at least one waveform, if the at least one time (determined per block 430) is within a time range of the given waveform and, if so, determine that the user is opening or closing the server-rack door by identifying the given waveform as matching the opening waveform or the closing waveform.

The door can be determined to be open when the numbers of opening waveforms and closing waveforms are unequal or when a sum of the numbers of opening waveforms and closing waveforms is odd-numbered. The door can be determined to be open when the numbers of opening waveforms and closing waveforms are equal or when a sum of the numbers of opening waveforms and closing waveforms is even-numbered.

At block 460, provide, by the controller, a notification of an open status of the server-rack door based on numbers of opening waveforms and closing waveforms indicating the open status. The notification can be internalized to the system in order to "inform" the controller of the status and obtain a control result depending on the status. In an embodiment, the notification is provided to the user in a user perceptible manner (audible, visual, and/or tactile (vibration when in front of a particular door being evaluated)).

At block 470, automatically close, by the controller, the server-rack door, responsive to the notification. In an embodiment, the server rack door can be automatically closed responsive to the notification and a close-door signal initiated by the user. In an embodiment, any of an electronic, a magnetic or an electromagnetic door closing system can be used to automatically close the server-rack door, responsive to a close door confirmation signal from the controller.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment. However, it is to be appreciated that features of one or more embodiments can be combined given the teachings of the present invention provided herein.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended for as many items listed.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A system for automatically closing a server-rack door, comprising:
    a microphone, comprised in a device carried by a user, configured to acquire sound data;
    an acceleration sensor, comprised in the device, configured to acquire acceleration data in a walking direction of the user; and
    a controller, operatively coupled to the microphone and the acceleration sensor, configured to
        determine at least one time when a volume of the sound data exceeds a threshold,
        identify at least one waveform from the acceleration data which matches (i) an opening waveform representing an acceleration waveform when the user is opening a server-rack door among a plurality of server-rack doors or (ii) a closing waveform representing an acceleration waveform when the user is closing the server-rack door and displaying a symmetrized shape of the first waveform,
        check, for each given waveform from among the at least one waveform, if the at least one time is within a time range of the given waveform and, if so, determine that the user is opening or closing the server-rack door by identifying the given waveform as matching the opening waveform or the closing waveform,
        provide a notification of an open status of the server-rack door based on numbers of opening waveforms and closing waveforms indicating the open status; and
        automatically close the server-rack door, responsive to the notification.

2. The system of claim 1, further comprising a magnetic door closing system for automatically closing the server-rack door, responsive to a close door signal from the controller.

3. The system of claim 1, wherein the symmetrized shape of the first waveform indicates both an opening and a closing of the server-rack door.

4. The system of claim 1, wherein the controller sets the threshold based on steady state volume data acquired and averaged over a given period of time.

5. The system of claim 1, further comprising a low-pass filter, operatively coupled to the controller, for low-pass filtering the acceleration data to filter out the acceleration data corresponding to directions other than the walking direction of the user.

6. The system of claim 1, wherein the acceleration data comprises data indicative of steps taken towards and away from the server-rack door indicative of closing and opening the server-rack door, respectively.

7. The system of claim 1, wherein the server rack door is automatically closed responsive to the notification and a close-door confirmation signal initiated by the user.

8. The system of claim 1, wherein the door is determined to be open when the numbers of opening waveforms and closing waveforms are unequal.

9. The system of claim 1, wherein the door is determined to be open when a sum of the numbers of opening waveforms and closing waveforms is odd-numbered.

10. The system of claim 1, wherein the door is determined to be closed when the numbers of opening waveforms and closing waveforms are equal.

11. The system of claim 1, wherein the door is determined to be closed when a sum of the numbers of opening waveforms and closing waveforms is even-numbered.

12. The system of claim 1, wherein the device is a smartphone.

13. The system of claim 1, wherein the device is a tablet.

14. A method for automatically closing a server-rack door, comprising:
acquiring, by a microphone comprised in a device carried by a user, sound data;
acquiring, by an acceleration sensor comprised in the device, acceleration data in a walking direction of the user;
determining, by a controller operatively coupled to the microphone and the acceleration sensor, at least one time when a volume of the sound data exceeds a threshold;
identifying, by the controller, at least one waveform from the acceleration data which matches (i) an opening waveform representing an acceleration waveform when the user is opening a server-rack door among a plurality of server-rack doors or (ii) a closing waveform representing an acceleration waveform when the user is closing the server-rack door and displaying a symmetrized shape of the first waveform;
checking, by the controller, for each given waveform from among the at least one waveform, if the at least one time is within a time range of the given waveform and, if so, determining that the user is opening or closing the server-rack door by identifying the given waveform as matching the opening waveform or the closing waveform,
providing, by the controller, a notification of an open status of the server-rack door based on numbers of opening waveforms and closing waveforms indicating the open status; and
automatically closing, by the controller, the server-rack door, responsive to the notification.

15. The method of claim 14, further comprising a magnetic door closing system for automatically closing the server-rack door, responsive to a close door signal from the controller.

16. The method of claim 14, wherein the symmetrized shape of the first waveform indicates both an opening and a closing of the server-rack door.

17. The method of claim 14, wherein the controller sets the threshold based on steady state volume data acquired and averaged over a given period of time.

18. The method of claim 14, further comprising a low-pass filter, operatively coupled to the controller, for low-pass filtering the acceleration data to filter out the acceleration data corresponding to directions other than the walking direction of the user.

19. The method of claim 14, wherein the acceleration data comprises data indicative of steps taken towards and away from the server-rack door indicative of closing and opening the server-rack door, respectively.

20. The method of claim 14, wherein the server rack door is automatically closed responsive to the notification and a close-door confirmation signal initiated by the user.

\* \* \* \* \*